(12) United States Patent
Nalluri et al.

(10) Patent No.: US 11,941,248 B2
(45) Date of Patent: Mar. 26, 2024

(54) COMPRESSION OF SPARSE TENSORS

(71) Applicant: Xilinx, Inc., San Jose, CA (US)

(72) Inventors: Vamsi Krishna Nalluri, Sunnyvale, CA (US); Sai Lalith Chaitanya Ambatipudi, Hyderabad (IN); Mrinal J. Sarmah, Santa Clara, CA (US); Rajeev Patwari, Campbell, CA (US); Shreyas Manjunath, San Jose, CA (US); Sandeep Jayant Sathe, Pune (IN)

(73) Assignee: XILINX, INC., San Jose, CA (US)

(*) Notice: Subject to any disclaimer, the term of this patent is extended or adjusted under 35 U.S.C. 154(b) by 273 days.

(21) Appl. No.: 17/643,999

(22) Filed: Dec. 13, 2021

(65) Prior Publication Data

US 2023/0185451 A1 Jun. 15, 2023

(51) Int. Cl.
*G06F 3/06* (2006.01)

(52) U.S. Cl.
CPC ............ *G06F 3/0608* (2013.01); *G06F 3/064* (2013.01); *G06F 3/0673* (2013.01)

(58) Field of Classification Search
None
See application file for complete search history.

(56) References Cited

U.S. PATENT DOCUMENTS

| | | | | |
|---|---|---|---|---|
| 6,348,881 B1* | 2/2002 | Buer | ............ | H03M 7/3084 375/240 |
| 7,079,051 B2* | 7/2006 | Storer | ............ | H03M 7/30 341/51 |
| 10,664,165 B1* | 5/2020 | Faibish | ............ | G06F 3/0638 |
| 10,936,311 B1 | 3/2021 | Liu et al. | | |
| 2013/0166861 A1* | 6/2013 | Takano | ............ | G06F 3/064 711/161 |
| 2014/0143517 A1* | 5/2014 | Jin | ............ | G06F 12/023 711/171 |
| 2015/0333766 A1* | 11/2015 | Nasser | ............ | H03M 7/46 341/59 |
| 2018/0095674 A1* | 4/2018 | Alameldeen | ............ | G06F 3/064 |
| 2019/0034091 A1* | 1/2019 | Arelakis | ............ | G06F 12/0811 |
| 2019/0081637 A1* | 3/2019 | Pool | ............ | G06F 12/0866 |
| 2020/0042189 A1* | 2/2020 | Shao | ............ | G06N 5/02 |
| 2020/0265107 A1* | 8/2020 | Narayanamoorthy | ............ | G06F 7/5443 |
| 2021/0036714 A1* | 2/2021 | Martin | ............ | H03M 7/6064 |
| 2021/0326144 A1* | 10/2021 | Raha | ............ | G06N 3/045 |

OTHER PUBLICATIONS

U.S. Appl. No. 16/881,612, filed May 22, 2020, entitled: Tensor Compression. The Examiner is referred to the copending patent prosecution of the common Applicant.

* cited by examiner

*Primary Examiner* — Christopher D Birkhimer
(74) *Attorney, Agent, or Firm* — Crawford Maunu PLLC

(57) ABSTRACT

Approaches for data compression involve a compression circuit packing non-zero data elements of a succession of words of a plurality of blocks into packed words by packing non-zero data elements of one or more words of the succession in each packed word, and restricting each packed word to data elements of one uncompressed block. The compression circuit writes each packed word in a RAM and within a compressed address range associated with the uncompressed block when the packed word is full of non-zero data elements, or before the packed word is full if the next input word is of another uncompressed block.

20 Claims, 11 Drawing Sheets

COMPRESSION OF SPARSE TENSORS

TECHNICAL FIELD

The disclosure generally relates to compression of sparse tensors.

BACKGROUND

Large scale neural networks perform computationally intensive operations on large data sets. The computations require substantial computational resources and memory bandwidth in executing multiply accumulate operations involved in convolution operations. Neural network accelerators have been developed to offload computations from processors executing software to hardware structures adapted to perform numerous multiply-and-accumulate operations in parallel.

Neural network accelerators are often implemented as system-on-chips (SoCs) and are generally configured to fetch weights and input tensors to be processed from off-chip memory. For example, operations performed by a neural network accelerator include convolutions on tensors and storage of the output tensor back to memory for operations of the next layer of the neural network. To increase computational efficiency, tensors output from one layer and processed according to the next layer can be stored in and then fetched from on-chip memory, which typically has greater bandwidth and less latency than off-chip memory. The amount of on-chip memory is often limited, however, causing spilling of data to off-chip memory when large tensors are processed and resulting in reduced performance.

SUMMARY

A disclosed method includes packing non-zero data elements of a succession of words of a plurality of uncompressed blocks into packed words by a compression circuit. The packing includes packing non-zero data elements of one or more words of the succession in each packed word, and restricting each packed word to data elements of one uncompressed block of the plurality of uncompressed blocks. The method additionally includes writing each packed word in a RAM and within a compressed address range associated with the one uncompressed block. The writing includes initiating the writing in response to the packed word being full of non-zero data elements, or initiating the writing before the packed word is full of non-zero data elements of a one uncompressed block of the plurality of uncompressed blocks, in response to a next input word of the succession being of another uncompressed block of the plurality of uncompressed blocks.

A disclosed circuit arrangement includes a random access memory (RAM) and a write compression circuit. The write compression circuit is configured to pack non-zero data elements of a succession of words of a plurality of uncompressed blocks into packed words, by packing non-zero data elements of one or more words of the succession in each packed word and restricting each packed word to data elements of one uncompressed block of the plurality of uncompressed blocks. The write compression circuit is configured to write each packed word in the RAM and within a compressed address range associated with the one uncompressed block. The writing includes initiating the writing in response to the packed word being full of non-zero data elements, and initiating the writing before the packed word is full of non-zero data elements of a one uncompressed block of the plurality of uncompressed blocks, in response to a next input word of the succession being of another uncompressed block of the plurality of uncompressed blocks.

Other features will be recognized from consideration of the Detailed Description and Claims, which follow.

BRIEF DESCRIPTION OF THE DRAWINGS

Various aspects and features of the methods and system will become apparent upon review of the following detailed description and upon reference to the drawings in which:

FIG. 6 shows an example of compressing data to be written to RAM according to the disclosed methods and circuits;

FIG. 8 shows an example of reading compressed data from RAM and decompressing the compressed data according to the disclosed methods and circuits;

DETAILED DESCRIPTION

Figure 1:
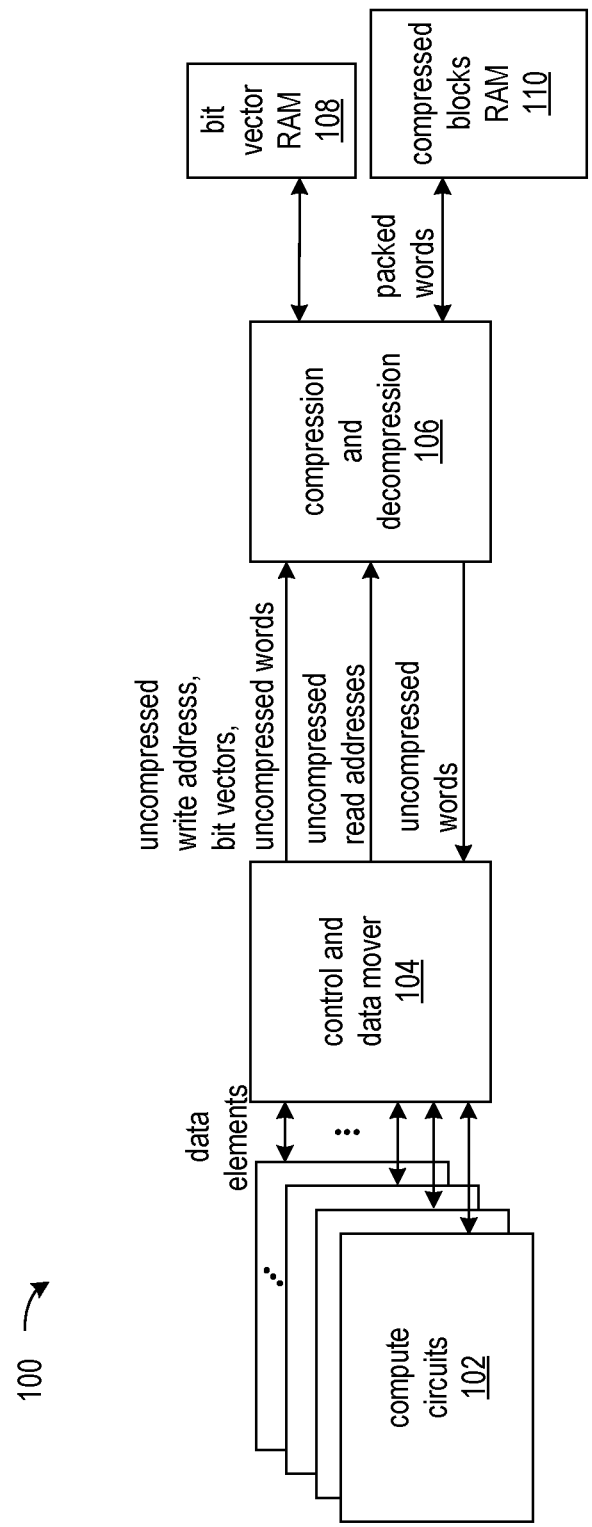
FIG. 1 shows a block diagram of a system in which the disclosed compression and decompression approaches can be employed.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed methods and circuits seek to eliminate or reduce accesses to off-chip memory during tensor processing while keeping multiple compute circuits busy while processing tensors. Though the methods and circuits are described with reference to tensor processing, it will be recognized that the methods and circuits can be employed in other applications in which addresses within blocks are presented in sequential order and the block order of those addresses not being in block order.

Some neural network accelerators have multiple compute circuits that can operate in parallel and perform operations, such as multiply-and-accumulate, on different portions of large tensors. An on-chip control circuit can orchestrate distribution of data to the compute circuits and assembly of output data from the compute circuits into output tensors. The control circuit can receive output tensor data generated by the compute circuits and organize the output data elements as "blocks" for writing to a RAM and reading from the RAM for processing by the compute circuits. Each block is a portion of a tensor and includes multiple data elements.

An objective of the control circuit is to keep the compute circuits busy and minimize idling in order to maximize performance. Thus, the control circuit may initiate accesses as soon as possible for each of the compute circuits. However, accesses to tensor data while processing by the multiple compute circuits may not be presented at regular intervals.

Tensor processing in neural networks sometimes involves large, sparse tensors. A sparse tensor is a tensor having a large proportion of zero values relative to non-zero values. To reduce on-chip RAM requirements for storing sparse tensors, the disclosed methods and circuits compress sparse tensors processed by the compute circuits by writing only the non-zero values of tensor data to RAM, along with data that indicate zero values and non-zero values of the uncompressed data. The compressed data is decompressed when read and provided to the compute circuits for processing.

As accesses to the tensor data can be initiated for the compute circuits at irregular intervals due to differences in the input tensor data presented for processing, the control circuit may initiate writes of output data for different blocks in an interleaved fashion. For example, if N compute circuits are generating N blocks of tensor data in parallel, the control circuit may initiate a sequence of writes of data computed by one compute circuit for block i of the N blocks and before the complete data of block i is available to be written, initiate a sequence of writes of data by another one of the compute circuits for block j of the N blocks. The disclosed compression and decompression circuitry handles compression/decompression when accesses to portions of different blocks are intermixed in requests for writing to/reading from RAM.

FIG. 1 shows a block diagram of a system 100 in which the disclosed compression and decompression approaches can be employed. The system can be a system-on-chip (SoC) or a system-in-package (SiP), for example. The components that are structurally part of the SoC or SiP are referred to herein as "on-chip" for ease of reference.

The system includes multiple compute circuits 102, a control and data mover circuit 104, compression and decompression circuits 106, and one or more RAMs 108 and 110. The compression and decompression circuits reduce on-chip memory requirements for data processed by the compute circuits, which allows the data to remain on-chip. The compression and decompression also improves performance by reducing or eliminating off-chip retrieval and writing of data. Enabling data to remain on-chip during processing can be especially beneficial in neural network applications. In neural network applications, data generated by and output from one layer of processing can be input data to the next layer of processing.

The compute circuits 102 can operate in parallel, and in an exemplary application, perform multiply and accumulate computations associated with tensor processing. Examples of the compute circuits include AI engines and digital signal processing circuits implemented in programmable devices from Xilinx, Inc.

The control and data mover 104 provides instructions to the compute circuits that control the computations. Orders of computations by the compute circuits and selections of which compute circuit processes which data are also controlled by the control and data mover. The control and data mover generates addresses for reading data to be processed by the compute circuits and generates addresses for writing data processed by the compute circuits. In neural network applications, the control and data mover circuit can direct multiple ones of the compute circuits to operate on different portions of a tensor, by distributing the data to the compute circuits for processing and reassembling the generated data back into a tensor for subsequent processing.

According to an example, a block of data elements can be a portion (e.g., a tile) of a tensor, and the block relative address of a block is the location of data elements of that block within the tensor. For ease of reference, the block relative addresses of the blocks of a tensor composed of X blocks are enumerated 0 to X−1.

Multiple (e.g., N) compute circuits can process multiple (N) blocks in parallel. The compute circuits operating in parallel can generate output data at different rates and at different times, and the control and data mover circuit can provide input data to the compute circuits accordingly. The control and data mover circuit initiates writing of output data from the compute circuits to RAM.

As the compute circuits operate on different blocks and generate output data at different times, the control and data mover circuit may interleave the reading and writing of data of different blocks. For example, the control and data mover circuit may initiate a sequence of reads/writes from block i, followed by a sequence of reads/writes from block i+1, followed by a sequence of reads/writes from block i, followed by a sequence of reads/writes from block i+3, etc., where each sequence addresses less than all of the data elements of the block.

Some neural network processing may involve sparse tensors. The compression and decompression circuitry enables the compute circuits to operate on uncompressed data (data having zero values) while storing only non-zero values of sparse tensors. To reduce storage requirements, the compression circuit stores only the non-zero data elements and saves bit vectors that indicate which data elements in a word have zero values and which data elements have non-zero values. Notably, the compression and decompression circuits can handle reads and writes of block data elements that are not presented in block order.

Figure 2:
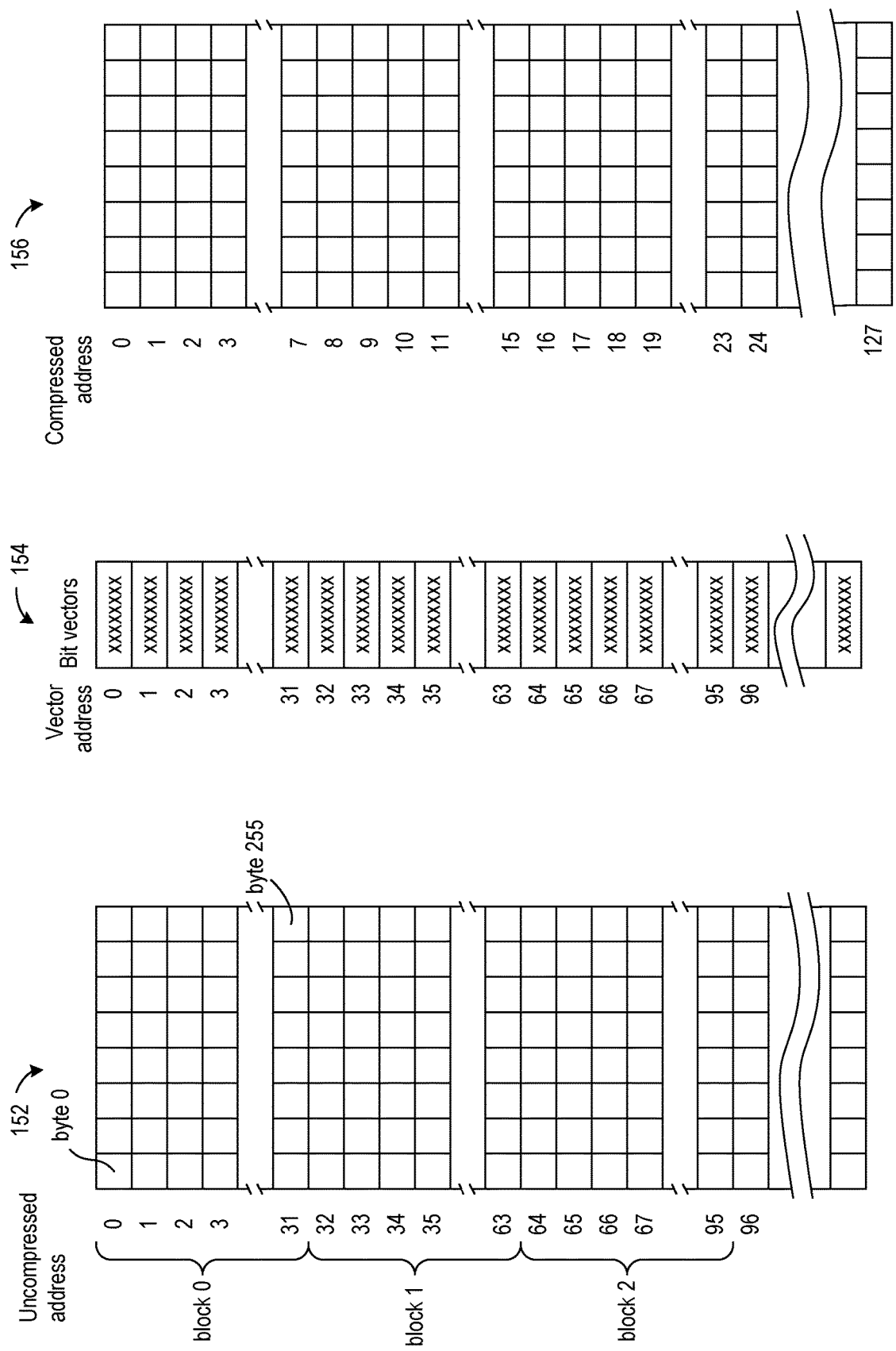
FIG. 2 shows an example mapping of uncompressed blocks of data to compressed blocks of data.

The system includes one or more RAMs 108 and 110 for storing bit vectors and compressed blocks of data FIG. 2 shows an example mapping of uncompressed blocks of data to compressed blocks of data. The disclosed approaches enable compression and decompression of data elements referenced in writes and reads that are not presented in block order. The example assumes a block size of 32 8-byte words, 75% sparsity (at least 75% of the data elements in each block are 0), and a maximum of N blocks being processed in parallel. The disclosed approaches can be adapted to blocks having more or fewer words, more or fewer bytes/word, different levels of sparsity, and/or data elements comprised of more than one byte. For neural network applications, the sparsity can be configurable for different layers of the network.

The control and data mover 104 (FIG. 1) can issue requests based on addresses that reference uncompressed blocks. These addresses are referred to as "uncompressed addresses." In a read request from the control and data mover for uncompressed data to be processed by a compute circuit, the uncompressed address is an "uncompressed read address," and in a write request from the control and data mover, the uncompressed address for data that has been generated by a compute circuit is an "uncompressed write address."

Uncompressed blocks 152 of data elements and associated uncompressed write addresses are shown on the left side of the figure, associated bit vectors 154 are shown in the middle, and compressed data ("packed words") and associated compressed addresses are shown on the right side of the diagram. The uncompressed blocks 152 are representative of data of an output tensor generated by multiple compute circuits or data of an input tensor to be processed by multiple compute circuits, for example.

The uncompressed data is organized by block in a block address relative order. Block 0 begins at uncompressed word address 0, block 1 begins at uncompressed word address 32, block 2 begins at uncompressed word address 64, etc. According to the example, each byte of a word of the uncompressed data 152 is a data element whose value is either zero or non-zero.

Each of the bit vectors 154 is associated with a word of uncompressed data. Bits in a bit vector indicate which data elements of a word are zero and which elements are non-zero. A bit value of 0 at a bit position in the bit vector indicates that the data element at that byte position in the associated uncompressed word is 0, and a bit value 1 indicates that the corresponding data element is non-zero. The address of the bit vector associated with an uncompressed word address can be the same or have the same offset as the address of the uncompressed word address.

The compressed data 156 includes non-zero values of data elements of the uncompressed data 152. The amount of storage provided in RAM for compressed blocks is based on an assumed minimum level of sparsity, the size of the blocks, and the number of blocks that can be undergoing compression/decompression. For example, if each block is assumed to be 75% sparse, has 32 words (assuming 8-byte words and 1-byte data elements), and 16 blocks can be undergoing compression/decompression, then the quantity of RAM allocated for compressed data of 16 blocks is 0.25*32*16=128 words. Eight words of RAM is available for storage of non-zero values found in a block of uncompressed data.

A range of compressed addresses can be allocated for storage for the packed words of each of the N blocks undergoing compression/decompression. For example, compressed addresses 0-7 can be dedicated to storing non-zero values of uncompressed addresses 0-31 over one compression/decompression interval, dedicated to storing non-zero values of uncompressed addresses 512-543 over a subsequent compression/decompression interval, dedicated to storing non-zero values of uncompressed addresses 1536-1567 over a subsequent compression/decompression interval, etc. Similarly, compressed addresses 8-15 can be dedicated to storing non-zero values of uncompressed addresses 32-63 over one compression/decompression interval, dedicated to storing non-zero values of uncompressed addresses 544-575 over a subsequent compression/decompression interval, etc.

Figure 3:
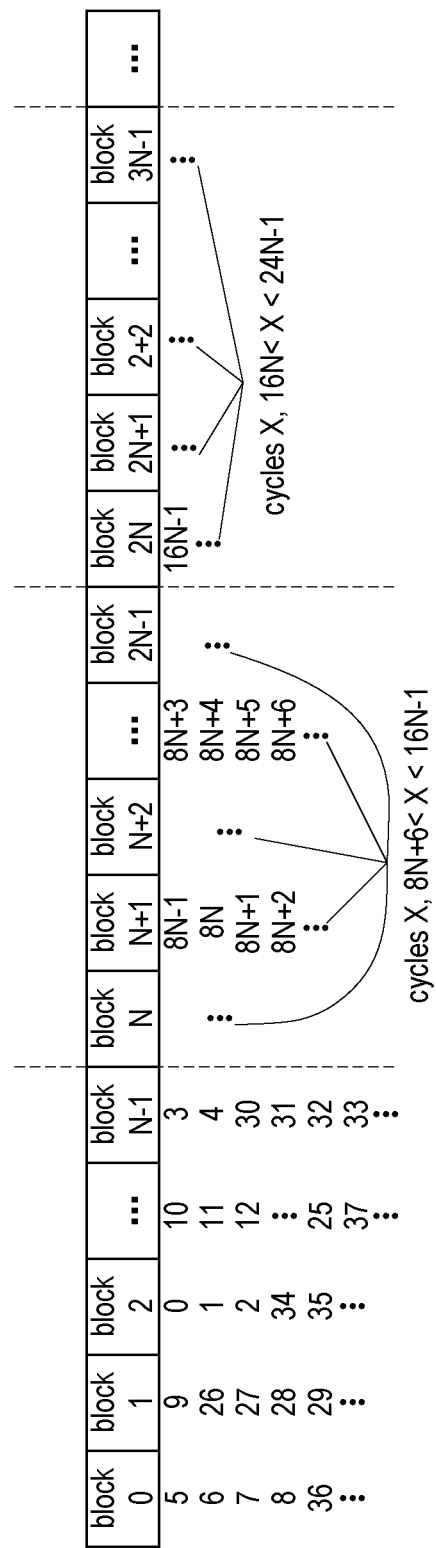
FIG. 3 shows an example in which uncompressed write addresses and uncompressed data of different blocks are presented in in successive cycles for compression.

FIG. 3 shows an example in which uncompressed write addresses and uncompressed data of different blocks are presented in in successive cycles for compression. Though the example is described in terms of compression based on uncompressed write addresses and uncompressed data, reading of compressed data and decompression may similarly be to portions of different blocks in successive cycles. The example shows that over some number of cycles, portions of N blocks are undergoing compression.

The blocks are shown in block relative address order, and each number below a block indicates a cycle in which an uncompressed address and a word of uncompressed data are presented for compression. For example, in cycle 0, an uncompressed address and associated uncompressed data within block 2 is presented for compression, in cycle 1 the next uncompressed address of block 2 and associated uncompressed data is presented for compression, in cycle 2 the next uncompressed address of block 2 and associated uncompressed data is presented for compression, in cycle 3 the first uncompressed address of block N−1 and associated uncompressed data is presented for compression, in cycle 4 the next uncompressed address of block N−1 and associated uncompressed data are presented for compression, and so on.

Up to N of the blocks can be undergoing compression/decompression at any one time. When the last uncompressed address within a block has been presented as an uncompressed read address and the data decompressed, compression can commence on a corresponding block in the next group of N blocks. For example, once the data at the last address of block 2 has been decompressed, compression of data at addresses within block N+2 can commence. Though an application may be unlikely to reference an address in block 0 in one cycle and in the next cycle reference an address in block N−1, the disclosed compression/decompression methods and circuits can handle that scenario and similar scenarios.

Figure 4:
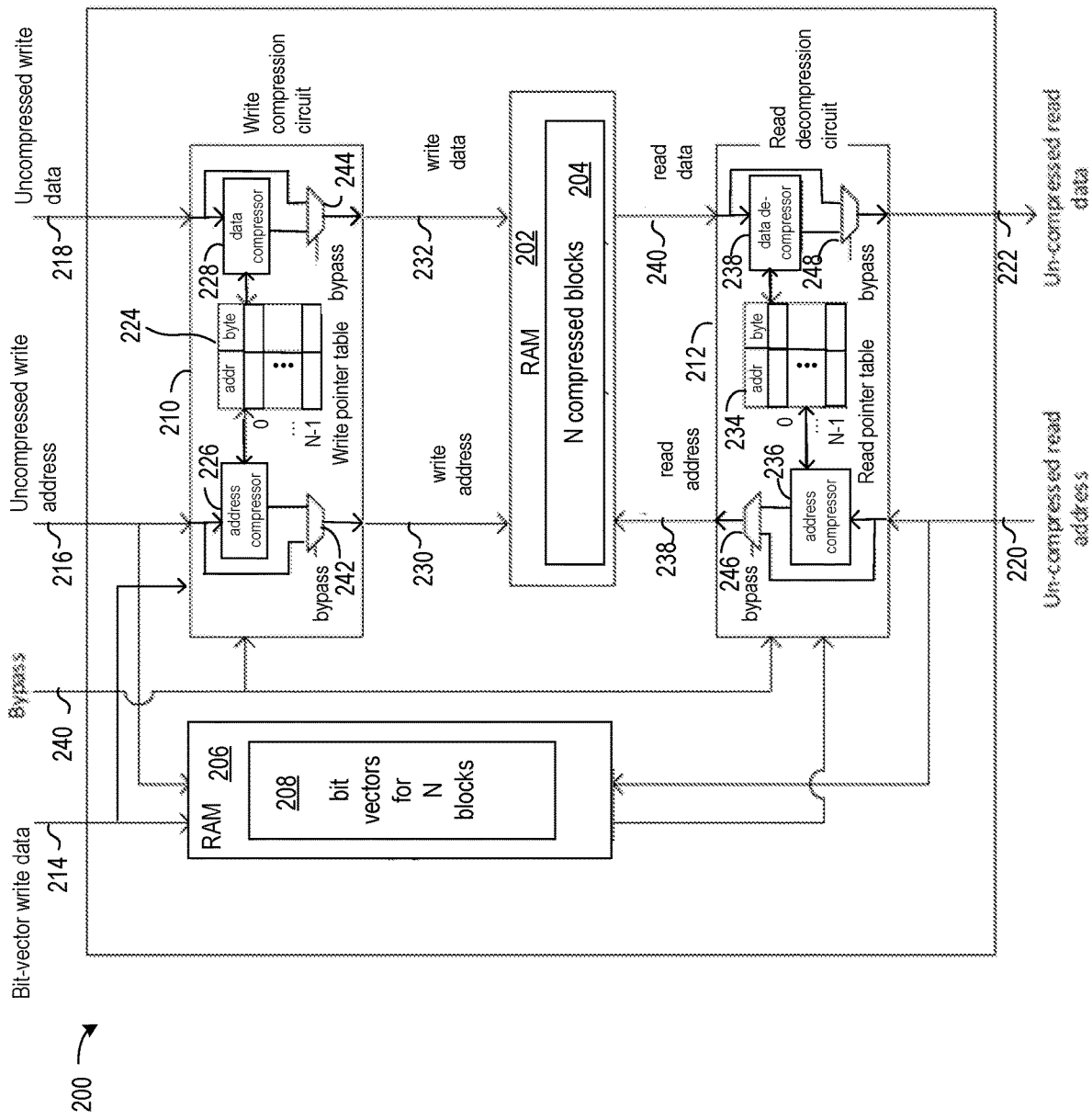
FIG. 4 shows a circuit diagram of an exemplary circuit arrangement for compression and decompression consistent with the disclosed methods and circuits.

FIG. 4 shows a circuit diagram of an exemplary circuit arrangement for compression and decompression consistent with the disclosed methods and circuits. The circuit arrangement 200 includes one or more RAMs 202 for storing N compressed blocks 204, a RAM 206 for storing bit vectors 208 associated with words of the N blocks, a write compression circuit 210, and a read compression circuit 212. The RAMs 202 and 206 can be dual port RAMs to enable concurrent writing and reading of compressed data and bit vectors.

For writing data elements of blocks and compressing, the inputs to the circuit arrangement 200 include bit vectors 214, uncompressed write addresses 216, and uncompressed write data 218. For reading compressed data elements of blocks and decompressing, the inputs to the circuit arrangement include uncompressed read addresses 220, and the circuit arrangement outputs uncompressed read data 222.

The write compression circuit compresses non-zero data elements of uncompressed write data 218 into packed words and writes the packed words to RAM 202. Because the write compression circuit may have started compression and assembling the non-zero values into a packed word for one block, and data elements of a different block may be presented to the write compression circuit before the packed word of associated with the one block has been completely filled with non-zero values, the write compression circuit tracks the address of the last packed word written to RAM 202 and the byte offset within the packed word at which the last non-zero value is located. The write compression circuit maintains a write pointer table 224 to track for each block, the address of the last packed word written to RAM 202 for that block and the byte offset within the packed word at which the last non-zero value is located. The write pointer table 224 can be implemented by block RAM or look-up table in an FPGA or a RAM in an ASIC, for example.

For each uncompressed word of data elements to be compressed and written in RAM 202, the write compression circuit 210 inputs an associated uncompressed write address and an associated bit vector. The address compressor circuit 226 of the write compression circuit reads from the write pointer table 224 at an address derived from the uncompressed write address, and the data compressor circuit 228 forms a packed word based on the byte offset indicated by the entry read from the write pointer table and the non-zero data elements in the uncompressed write data indicated by the bit vector. Based on the uncompressed write address, the address compressor circuit 226 generates a compressed write address 230 and provides the address to the RAM 202 for writing the compressed write data ("packed word") 232 to the RAM. The address compressor circuit 226 can determine the entry to read from the write pointer table using the $\log_2 N$ most significant bits from the input uncompressed write address, where N is the number of compressed blocks that can be stored in the RAM. For example, if N=16, then the 4 most significant bits of the input uncompressed write address indicate the entry to read from the write pointer table.

In response to an input uncompressed read address 220, the read decompression controller 212 reads a packed word from the RAM 202, forms an uncompressed word, and outputs uncompressed read data 222. A packed word can contain non-zero data elements that span multiple uncompressed read addresses. Also, the read compression circuit may have decompressed data for an uncompressed read address of one block using non-zero data elements of a packed word, and an uncompressed read address of another block may be input before all the non-zero data elements have been extracted from the packed word. To manage the aforementioned possibilities, the read compression circuit tracks the address of the last packed word read from RAM 202 and the byte offset within the word from which the last non-zero value was extracted. The read decompression controller maintains a read pointer table 234 to track for each block, the address of the last packed word read from RAM 202 for that block and the byte offset within the packed word from which the last non-zero value was extracted. The read pointer table 234 can be implemented by block RAM or look-up table in an FPGA or a RAM in an ASIC, for example.

The address compressor circuit 236 of the read decompression controller 212 reads an entry from the read pointer table at an address derived from the uncompressed read address. The address portion of the entry read from the read pointer table is used to generate a compressed read address 238 to the RAM for reading compressed read data (a packed word) 240. The address compressor circuit 236 can determine the entry to read from the read pointer table using the $\log_2 N$ most significant bits from the input uncompressed read address, where N is the number of compressed blocks that can be stored in the RAM.

The uncompressed read address is input to the bit vector RAM to obtain the associated bit vector. The data decompressor circuit 238 uses the associated bit vector and packed word read from the RAM 202 to generate an uncompressed word. The byte offset indicated by the entry read from the read pointer table is used to reference the first non-zero data element in the packed word to extract, and the bit vector is used to determine the byte position(s) in the uncompressed word at which to store zero values and to store non-zero value(s) extracted from the packed word.

The write compression circuit 210 and read compression circuit 212 are configured to be responsive to a bypass signal 240. The state of the bypass signal controls whether or not input data is to be compressed and whether or not data read from the RAM 202 is to be decompressed. In bypass mode, the write compression circuit provides the uncompressed write address 216 and uncompressed write data 218 for writing to the RAM by way of multiplexers 242 and 244. Also in bypass mode, the read decompression controller provides the uncompressed read address 220 to the RAM as a read address 238 and provides the data read from RAM as output by way of multiplexers 246 and 248.

Figure 5:
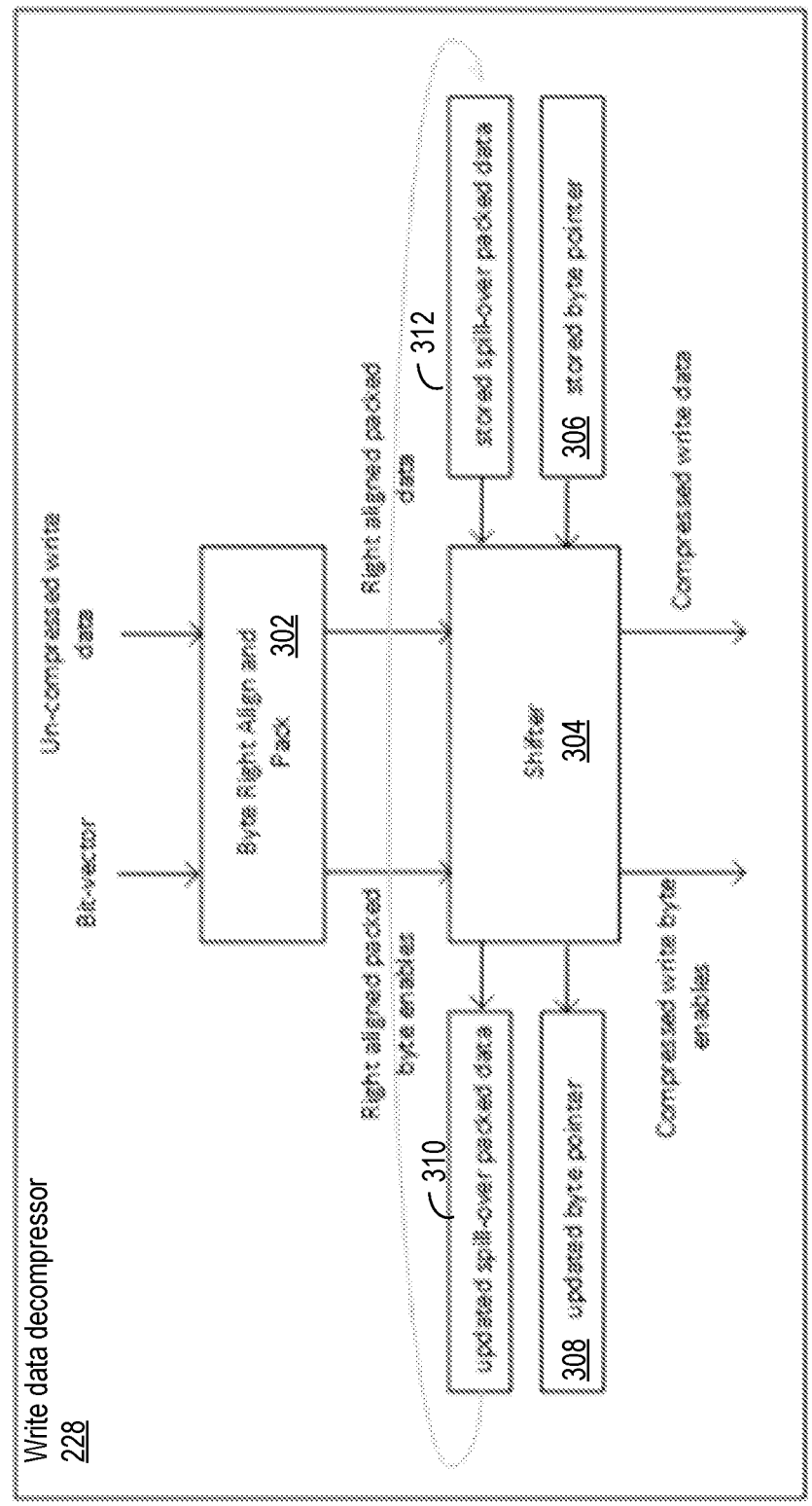
FIG. 5 shows an exemplary data compressor circuit.

FIG. 5 shows an exemplary data compressor circuit 228. The data compressor circuit inputs uncompressed write data 218 and an associated bit vector 214 to circuit 302. Circuit 302 packs and right-aligns the non-zero data values in a register (not shown) whose outputs are coupled to a shifter circuit 304. The "right aligned packed byte enable" signals generated by the circuit 302 enable storing the non-zero values in the appropriate bytes of a register.

The shifter circuit 304 inputs an entry from the write pointer table (FIG. 4, #224) and uses the byte pointer 306 from the entry to determine the byte position in the packed word being assembled for writing, at which the packed non-zero-values provided by circuit 302 are to be stored. The shifter circuit generates an updated byte pointer 308 based on the stored byte pointer and the number non-zero bytes added to the packed word being assembled. The shifter circuit stores the updated byte pointer back in the write pointer table. If the packed word is full, the shifter outputs the packed word as compressed write data. The "Compressed write byte enable" signals are generated by the shifter circuit to enable storing of non-zero values in selected bytes at an address in the RAM 202 (FIG. 4).

If the number of packed non-zero-values provided by circuit 302 cannot all be stored in the packed word being assembled, the shifter circuit 304 stores the extra non-zero values as updated spill-over packed data 310. In the next cycle that circuit 302 provides right-aligned packed data for the same block, the shifter circuit 304 inputs the stored spill-over packed data 312 to use in assembling the next packed word.

Figure 6:
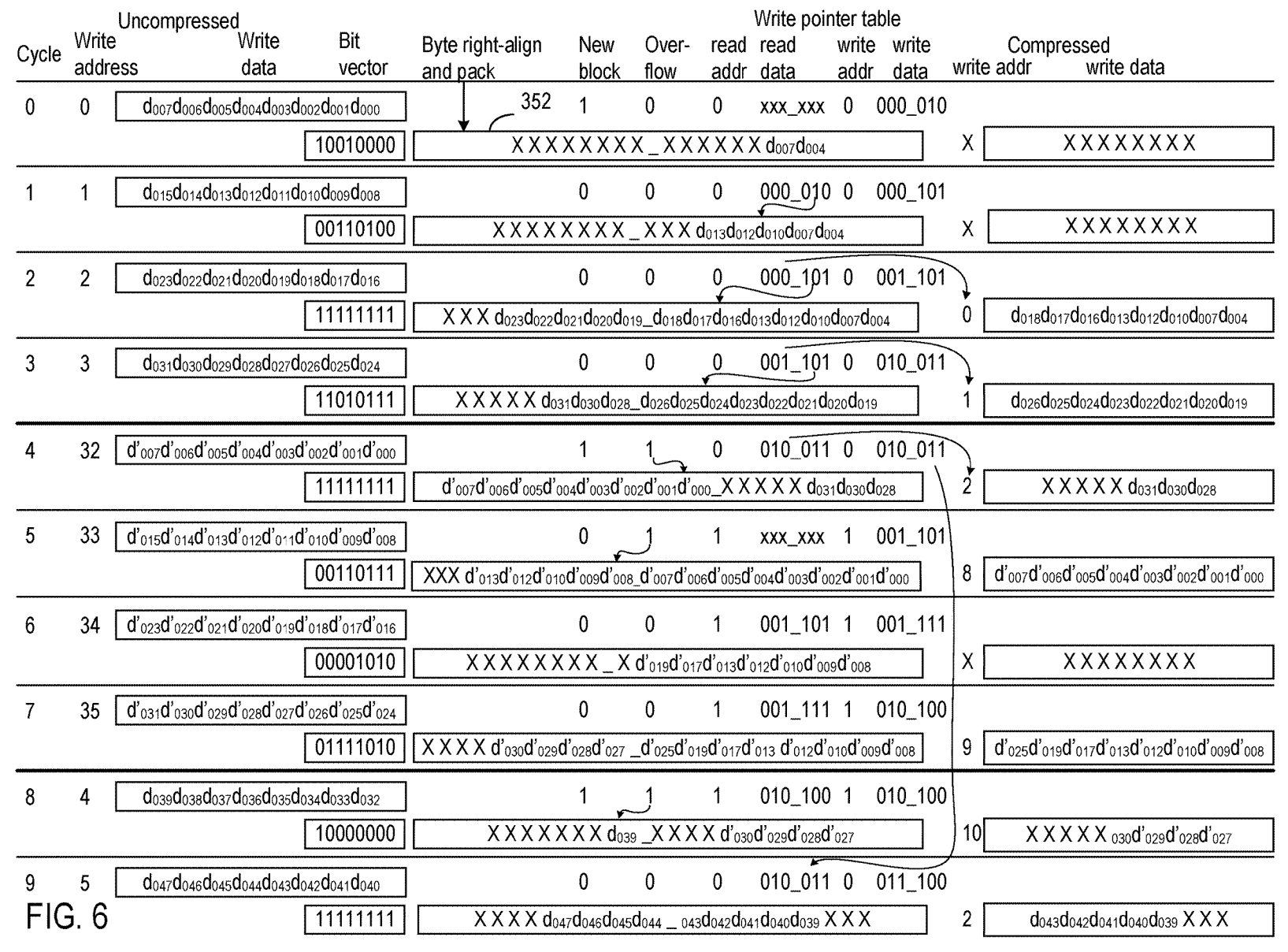

FIG. 6 shows an example of compressing data to be written to RAM according to the disclosed methods and circuits. The example involves compressing and writing of data of two different blocks. The example shows multiple compression cycles from top to bottom. In each compression cycle, an uncompressed write address and an uncompressed word of data are input and used assembling a packed word for writing to RAM. Though a packed word is not written to RAM in every compression cycle.

The example shows 10 compression cycles numbered 0 through 9. In cycles 0 through 3, uncompressed addresses and uncompressed data of a block 0 are input, in cycles 4 through 7 uncompressed addresses and uncompressed data of a block 1 are input, and in cycles 8 through 9 additional uncompressed addresses and uncompressed data of block 0 are input. The uncompressed write addresses are input in sequential order by block. Uncompressed write addresses 0 through 3 of block 0 are input in cycles 0 through 3, uncompressed write addresses 32 through 35 of block 1 are input in cycles 4 through 7, and uncompressed write addresses 4 through 5 are input in cycles 8 through 9.

The data elements of the uncompressed write data of block 0 are designated as "$d_{xyz}$," and the data elements of the uncompressed write data of block 1 are designated as "$d'_{xyz}$." The "xyz" subscript indicates the byte order of data elements in the block and can range from 000 to 255 within a block, for example.

In cycle 0, the uncompressed write address 0, uncompressed write data "$d_{007}d_{006}d_{005}d_{004}d_{003}d_{002}d_{001}d_{000}$," and bit vector "10010000" are input. The two non-zero data elements are $d_{007}$ and $d_{004}$ which are right-aligned and packed in register 352 as "X X X X X X X X_X X X X X X $d_{007}d_{004}$." The "X"s indicate byte positions in the register that do not have valid data elements. The register 352 is twice the size of an input word of uncompressed write data in order to provide storage of non-zero values that spill-over from one uncompressed write address to the next.

The values in the "New block" column indicate when an uncompressed write address, uncompressed write data, and associated bit vector are input for a block other than the block of the previous compression cycle. The New block value in cycles 0 and 4 is 1 to signal processing of a different block.

Four columns are under the "Write pointer table" heading as the write compression circuit 210 reads entries from and writes to the write pointer table. In each compression cycle, the write compression circuit reads an entry, packs non-zero values accordingly, updates the entry, and writes the updated entry back to the write pointer table. The "read addr" and "read data" columns under the "Write pointer table" heading show the address of the entry and the state of the entry read from the write pointer table, and "write addr" and "write data" columns show the address of the entry and the state of the entry written back to the table. The values in the "read data" and "write data" columns show the address offset and the byte offset portions of the entries. The address offset portion is left of the "_" character, and the byte offset portion is right of the "_" character.

The state of the Overflow signal controls whether or not the non-zero values extracted from the uncompressed input data are stored in the left-half of the register, beginning with the right-most non-zero value of the input data being stored in the right-most byte of the left-half of the register. In response to the Overflow signal being logic 1, the non-zero values are stored in register 352 beginning at byte position 8, in the example.

In cycle 0, the first uncompressed data of block 0 is input for compression and writing, and the entry in the write pointer table associated with uncompressed write address 0 does not yet have useful data, as shown by the value "xxx_xxx." A packed word is not output for writing to RAM in cycle 0, as shown by the "write data" column having "XXXXXXXX", because the register 352 has only two valid values ("X X X X X X X X_X X X X X X X $d_{007}d_{004}$"), which is insufficient for a complete packed word. A "complete" packed word has only non-zero values.

The entry in the write address table (write addr 0) associated with uncompressed write address 0 is updated with the value 000_010, which indicates that for compressed address offset 000, two (010) non-zero values have been right-aligned and packed in the register 352.

In cycle 1, uncompressed address 1, uncompressed data $d_{015}d_{014}d_{013}d_{012}d_{011}d_{010}d_{009}d_{008}$, and bit vector 00110100 are input. Non-zero data values $d_{013}d_{012}d_{010}$ are extracted from the uncompressed write data according to the bit vector, and the entry 000_010 read from the write pointer table indicates that the two right-most positions of register 352 are occupied and that $d_{013}d_{012}d_{010}$ are to be packed in the register beginning at the third position from the right. The "right aligned packed byte enable" signals generated by the circuit 302 (FIG. 5) enable storing the non-zero values in the appropriate bytes of register 352.

A packed word is not output for writing to RAM in cycle 1, because the register 352 has only five valid values ("X X X X X X X_X X X $d_{013}d_{012}d_{010}d_{007}d_{004}$"), which is insufficient for a complete packed word. The entry in the write address table (write addr 0) associated with uncompressed write address 0 is updated with the value 000_101, which indicates that for compressed address offset 000, five non-zero values have been right-aligned and packed in the register 352.

In cycle 2, uncompressed address 2, uncompressed data $d_{023}d_{022}d_{021}d_{020}d_{019}d_{018}d_{017}d_{016}$, and bit vector 11111111 are input. Non-zero data values $d_{023}d_{022}d_{021}d_{020}d_{019}d_{018}d_{017}d_{016}$ are extracted from the uncompressed write data according to the bit vector. The entry 000_101 read from the write pointer table indicates that the five right-most positions of register 352 are occupied and that $d_{023}d_{022}d_{021}d_{020}d_{019}d_{018}d_{017}d_{016}$ are to be packed in the register beginning at the sixth position from the right. A packed word is output for writing to RAM at compressed address 0 in cycle 2, because the register 352 has 8 valid values in the right-most 8 positions ("X X X $d_{023}d_{022}d_{021}d_{020}d_{019}d_{018}d_{017}d_{016}d_{013}d_{012}d_{010}d_{007}d_{004}$").

As a packed word is written at uncompressed address 0, the entry in the write address table (write addr 0) associated with uncompressed write address 0 is updated with the value 001_101, which indicates that after output of the packed word, for the next compressed address offset 001, five non-zero values remain and are right-aligned and packed in the register 352 (X X X $d_{023}d_{022}d_{021}d_{020}d_{019}$).

In cycle 3, uncompressed address 3, uncompressed data $d_{031}d_{030}d_{029}d_{028}d_{027}d_{026}d_{025}d_{024}$ and bit vector 11010111 are input. Non-zero data values $d_{031}d_{030}d_{028}\_d_{026}d_{025}d_{024}$ are extracted from the uncompressed write data according to the bit vector.

The entry 001_101 read from the write pointer table indicates that the five right-most positions of register 352 are occupied and that $d_{031}d_{030}d_{028}\_d_{026}d_{025}d_{024}$ are to be packed in the register beginning at the sixth position from the right. A packed word is output for writing to RAM at compressed address 1 in cycle 2, because the register 352 has 8 valid values in the right-most 8 positions ("X X X X X $d_{031}d_{030}d_{028}\_d_{026}d_{025}d_{024}d_{023}d_{022}d_{021}d_{020}d_{019}$").

In cycle 4 the New Block signal value 1 indicate that the input uncompressed write address 32 references a block different from the block references by the previous uncompressed write address (3). Uncompressed address 32, uncompressed data $d'_{007}d'_{006}d'_{005}d'_{004}d'_{003}d'_{002}d'_{001}d'_{000}$, and bit vector 11111111 are input. Non-zero data values $d'_{007}d'_{006}d'_{005}d'_{004}d'_{003}d'_{002}d'_{001}d'_{000}$ are extracted from the uncompressed write data according to the bit vector.

The entry 010_011 read from the write pointer table indicates that the three right-most positions of register 352 are occupied. And as the Overflow signal value in cycle 4 indicates that the right half of register 352 has non-zero values, the data elements $d'_{007}d'_{006}d'_{005}d'_{004}d'_{003}d'_{002}d'_{001}d'_{000}$ are not packed with data elements $d_{031}d_{030}d_{028}$ of the previous block beginning at the fourth position from the right in the register. Rather, the data elements are packed beginning at the eighth position in the register, and the partial packed word X X X X X $d_{031}d_{030}d_{028}$ is written at compressed write address offset 010. The entry 010_011 is preserved in the write pointer table for block 0. In order to have in cycle 5 the position in register 352 to begin packing the non-zero values input in cycle 5, the value of the New block signal and the value of the write data can be delayed/buffered for one cycle. In response to the Overflow signal being logic 1 in cycle 5 and the delayed version of the New block signal from cycle 4 being logic 1, the delayed version of the write data can be used to determine the position in the register 352.

In response to both the New block signal and the Overflow signal being logic 1, the write pointer table is not updated with a new value so that any subsequently input data for the block of the write data can be packed at that same compressed write address.

In cycles 5, 6, and 7, the uncompressed write addresses and data for block 1 are processed. In cycle 8, input of an uncompressed write addresses and data resumes for the same block of cycles 0 through 3. Note that in cycle 9, write enables are asserted for bytes 3-7 of the compressed write address 2 to write $d_{043}d_{042}d_{041}d_{040}d_{039}$ while preserving $d_{031}d_{030}d_{028}$, which were written in bytes 0-2 of compressed address 2 in cycle 4, as indicated by the write data "010_011" in cycle 4, which is the read data in cycle 9.

Figure 7:
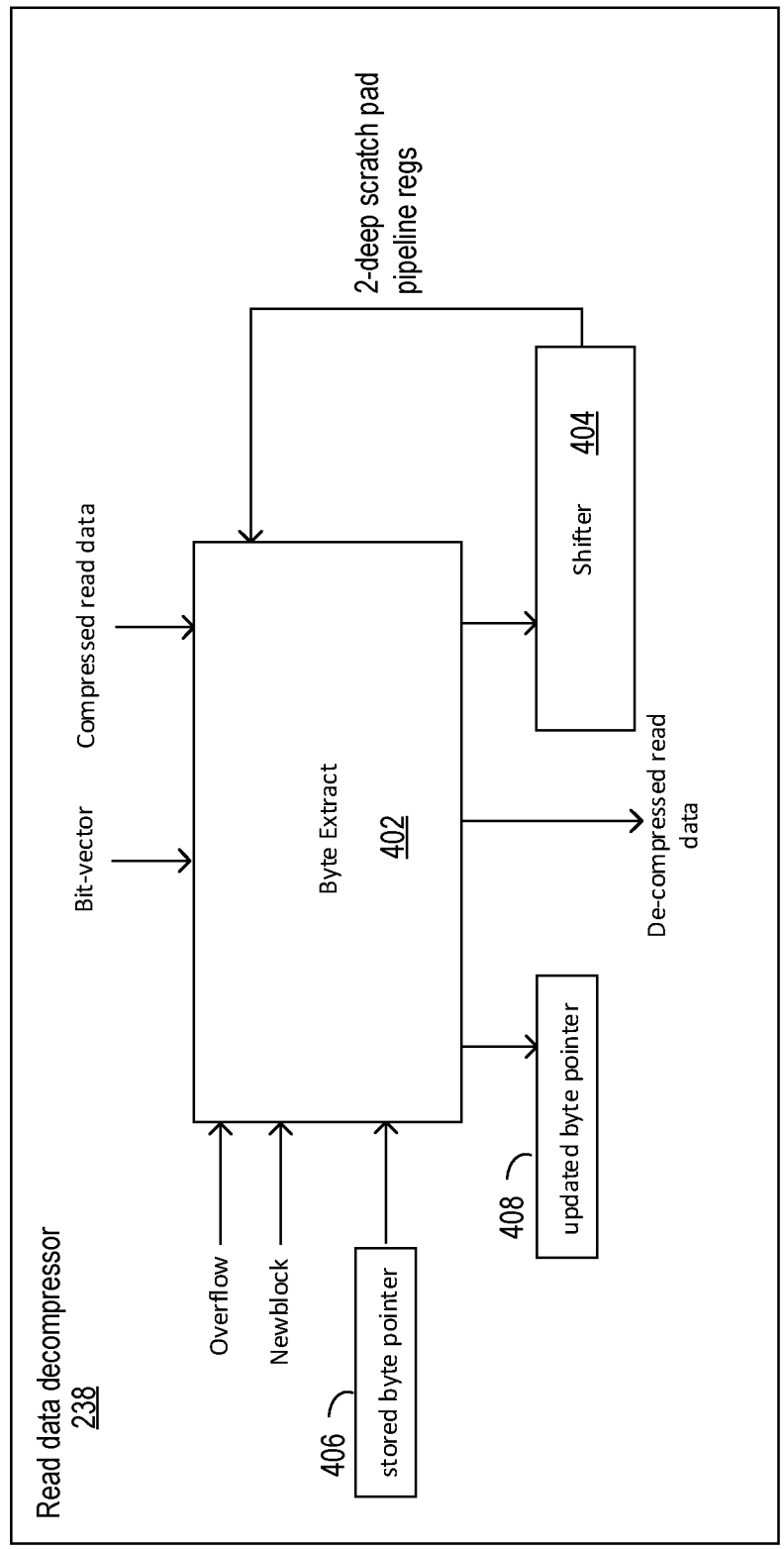
FIG. 7 shows an exemplary data decompressor circuit.

FIG. 7 shows an exemplary data decompressor circuit 238. The data decompressor circuit can include a byte extraction circuit 402 and a shifter circuit. The byte extraction circuit inputs compressed read data ("packed words") and an associated bit vector.

In response to an input packed word, the byte extraction circuit provides the packed word to shifter circuit 404. The shifter circuit shifts the contents of the 2-deep scratch pad pipeline registers to the right while shifting in the input packed word. The 2-deep scratch pad pipeline registers can include registers that store compressed data from two consecutive addresses of packed words in the RAM 202 (FIG. 2).

The byte extraction circuit 402 is configured to determine the number of values to extract from the 2-deep scratch pad pipeline registers based on the number of 1-bits in the input bit vector. The byte extraction circuit is also configured to determine the position in the 2-deep scratch pad pipeline registers at which to begin extraction based on the value of the stored byte pointer 406 read from the read pointer table 234 (FIG. 4) and on the states of the New block signal and the Overflow signal. The New block signal or the Overflow signal having logic value 1 signals that byte(s) are to be extracted from the 2-deep scratch pad pipeline registers beginning at the right-most (least significant) byte of the left half of the registers (register having compressed data of the greater of the consecutive addresses).

Note that the New block signal and the Overflow signal used in the in the read decompression controller 212 and the byte extraction circuit 402 are separate from signals of the same names used by the write compression circuit 210.

The byte extraction circuit is configured to generate an updated byte pointer 408 for storing in the read pointer table. The updated byte pointer is a sum of the number of bytes extracted from the 2-deep scratch pad pipeline registers and the beginning position from which the bytes were extracted. The address compressor 236 (FIG. 2) can enable storing the updated byte pointer at the proper address in the read pointer table 234.

The byte extraction circuit is configured to extract the number of bytes from the 2-deep scratch pad pipeline registers beginning at the determined position, and generate output data ("uncompressed words") based on the input bit vector and extracted bytes. The uncompressed word is associated with the uncompressed read address that was input to the address compressor 236 of the read decompression controller 212 (FIG. 4).

Figure 8:
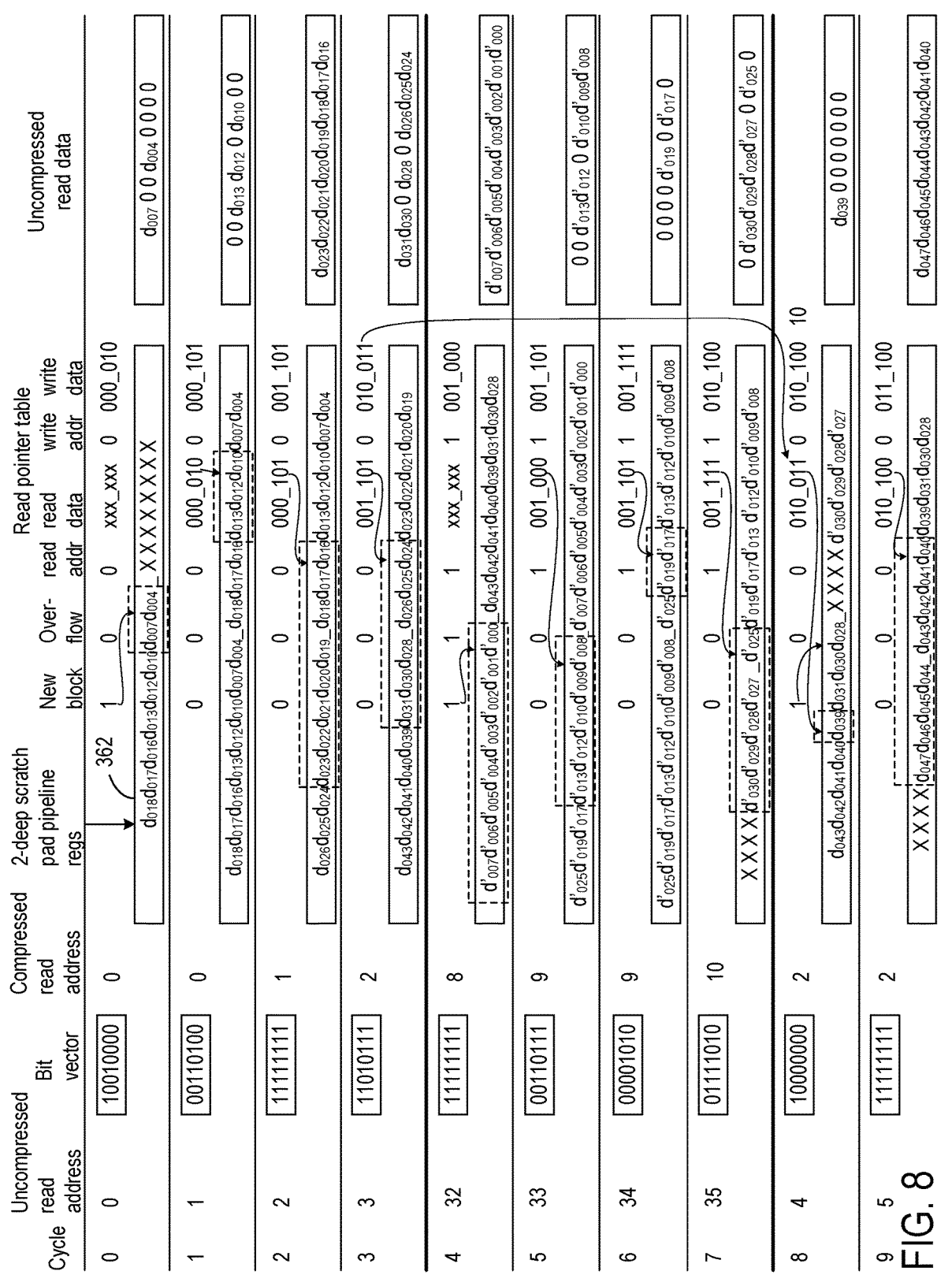

FIG. 8 shows an example of reading compressed data from RAM and decompressing the compressed data according to the disclosed methods and circuits. The example of FIG. 8 involves reading of the compressed data generated in the example of FIG. 6. The read decompression controller inputs an uncompressed read address and associated bit vector in each decompression cycle.

The read decompression controller determines the entry to read from the read pointer table based on the input uncompressed read address.

The read decompression controller determines whether or not to read a packed word from the next compressed read address based on the bit vector associated with the uncompressed read address and the byte offset portion of the entry read from the read pointer table. If after extraction of non-zero data elements for the preceding uncompressed read address from the previously read packed word, there remain a sufficient number of non-zero data elements to satisfy the number of non-zero data elements indicated by the bit vector, the packed word at the next compressed address need not be read. Otherwise, the packed word is read from the address that immediately follows the address indicated by the entry read from the read pointer table.

In cycle 0, the read pointer table entry for block 0 is read, and the entry does not initially have valid data, as indicated by the value xxx_xxx. In response to the first uncompressed read address input for a block, the read decompression controller defaults to read the first word ("Compressed read address" 0) of the compressed data of the block. The compressed word read from compressed read address 0 is $d_{018}d_{017}d_{016}d_{013}d_{012}d_{010}d_{007}d_{004}$ and that word is stored in the left-most 8 bytes of the scratchpad pipeline registers 362.

The bit vector associated with the uncompressed read address indicates that the uncompressed word of uncompressed read address 0 has two non-zero data elements, at byte positions 4 and 7. The read decompression circuit extracts the two right-most data elements from register 362, generates and outputs uncompressed read data "$d_{007}$ 0 0 $d_{004}$ 0 0 0 0" based on the extracted data values and bit vector, and writes 000_010 to the entry in the read pointer table for block 0. Note that the New block signal having logic value 1 signals that byte(s) are to be extracted beginning at the right-most byte of the left half of register 362. The read table entry 000_010 indicates the last compressed read address read was 0, and that the next byte extracted from register 362 are to begin at position 010 (the third byte from the right). Note that byte offsets are from 000 to 111 from right to left.

In cycle 1, uncompressed read address 1 and the associated bit vector are input to the read decompression controller. The entry read from the read pointer table is 000_010, which indicates that the last compressed word that was read is at compressed word address offset 0, and the extraction of the next elements is to begin at the third data element (data element position 010) from right in the register 362. The compressed word read in the previous cycle is shifted to the right half of register 362, and the compressed word at compressed address 0 is again read from RAM, because the bit vector indicates that the uncompressed read data is to contain 3 non-zero data elements, and there will be 3 elements remaining to be extracted from the compressed word of compressed address zero after extracting the three non-zero data elements of uncompressed address 1 (8−(3+2)=3). The compressed word of compressed address 0 is stored in the left half of register 362.

The bit vector associated with uncompressed read address 1 indicates that the uncompressed word of uncompressed read address 0 has three non-zero data elements, at byte positions 2, 4, and 5. The read decompression circuit extracts three data elements from register 362 beginning at the third byte (data element position 010) from the right, generates and outputs uncompressed read data "0 0 $d_{013}d_{012}$ 0 $d_{010}$ 0 0" based on the extracted data values and bit vector, and writes 000_101 to the entry in the read pointer table for block 0. The read table entry 000_101 indicates the previously read compressed read address was compressed address 0, and that the next extraction is to begin at the sixth data element from the right (data element position 101).

In cycle 2, uncompressed read address 2 and the associated bit vector are input to the read decompression controller. The entry read from the read pointer table is 000_101, which indicates extraction of the next elements is to begin at the sixth data element (data element position 101) from right in the register 362. The bit vector indicates that the uncompressed word is to contain 8 non-zero data elements. As three non-zero data elements of the 8 are present in register 362 from compressed address 0 the compressed word at the next compressed address will be read to provide the other 5 non-zero data elements.

The compressed word read in the previous cycle (compressed word at compressed address 0) is shifted to the right half of register 362, and the compressed word "$d_{026}d_{025}d_{024}d_{023}d_{022}d_{021}d_{020}d_{019}$" at compressed address 1 is read from RAM and stored in the left half of register 362. The bit vector associated with uncompressed read address 2 indicates that the uncompressed word of uncompressed read address 2 has 8 non-zero data elements, at byte positions 0 through 7. The read decompression circuit extracts the 8 data elements from register 362 beginning at the sixth byte (data element position 101) from the right, generates and outputs uncompressed read data "$d_{023}d_{022}d_{021}d_{020}d_{019}d_{018}d_{017}d_{016}$" based on the extracted data values and bit vector, and writes 001_101 to the entry in the read pointer table for block 0. The read table entry 001_101 indicates that the previously read compressed read address was compressed address 1, and that the next extraction is to begin at the sixth data element from the right (data element position 101).

In cycle 3, uncompressed read address 3 and the associated bit vector are input to the read decompression controller. The entry read from the read pointer table is 001_101, which indicates to the read decompression controller that previously read compressed word was at compressed address 1 and the extraction of the next elements is to begin at the sixth data element (data element position 101) from right in the register 362. The bit vector indicates that the uncompressed word is to contain 6 non-zero data elements. As 3 non-zero data elements of the 8 are present in register 362 from compressed address 1 the compressed word at the next compressed address will be read to provide the other 3 non-zero data elements.

The compressed word read in the previous cycle (compressed word at compressed address 1) is shifted to the right half of register 362, and the compressed word "$d_{043}d_{042}d_{041}d_{040}d_{039}d_{031}d_{030}d_{028}$" at compressed address 3 is read from RAM and stored in the left half of register 362. The bit vector associated with uncompressed read address 3 indicates that the uncompressed word of uncompressed read address 3 has 6 non-zero data elements, at byte positions 0-2, 4, and 6-7. The read decompression circuit extracts the 6 data elements from register 362 beginning at the sixth byte (data element position 101) from the right, generates and outputs uncompressed read data "$d_{031}d_{030}$ 0 $d_{028}$ 0 $d_{026}d_{025}d_{024}$" based on the extracted data values and bit vector, and writes 001_011 to the entry in the read pointer table for block 0. The read table entry 001_011 indicates that the previously read compressed read address was compressed address 1, and that the next extraction is to begin at the fourth data element from the right (data element position 011).

In cycle 4, uncompressed read address 32 and the associated bit vector are input to the read decompression controller. The value of the uncompressed read address is that of a block (block 1) different from the block (block 0) of the previously input uncompressed read address (3), and in response the New block signal is set.

The read decompression circuit reads the read pointer table entry for block 1, and the entry does not initially have valid data, as indicated by the value xxx_xxx. In response to the first uncompressed read address input for a block, the read decompression controller defaults to read the first word ("Compressed read address" 8) of the compressed data of the block. The compressed word in the left half of register 362 is shifted to the right half, and the compressed word of compressed read address 8 ($d'_{007}d'_{006}d'_{005}d'_{004}d'_{003}d'_{002}d'_{001}d'_{000}$) is read and stored in the left-most 8 bytes of the scratchpad pipeline registers 362.

The bit vector indicates that the uncompressed word is to contain 8 non-zero data elements. The read decompression circuit extracts the 8 data elements from register 362 beginning at the eighth byte from the right, as the New block signal indicates that the right half of register 362 has non-zero data elements of the previous block. The extracted data elements and bit vector are used to generate uncompressed read data $d'_{007}d'_{006}d'_{005}d'_{004}d'_{003}d'_{002}d'_{001}d'_{000}$. The read decompression circuit writes 001_000 to the entry in the read pointer table for block 0. The read table entry 001_000 indicates that the previously read compressed read address was compressed address 0, and that the next extraction is to begin at the first data element from the right (data element position 000).

In cycle 5, uncompressed read address 33 and the associated bit vector are input to the read decompression controller. The entry read from the read pointer table is 001_000, which indicates to the read decompression controller that the previously read compressed word was at compressed address 1 and the extraction of the next elements is to begin at the first data element (data element position 000) from right in the register 362. The bit vector indicates that the uncompressed word is to contain 5 non-zero data elements. As there are no non-zero data elements of the 5 present in register 362, the compressed word at the next compressed address will be read to provide the non-zero data elements.

The compressed word read in the previous cycle (compressed word at compressed address 8) is shifted to the right half of register 362, and the compressed word "$d'_{025}d'_{019}d'_{017}d'_{013}d'_{012}d'_{010}d'_{009}d'_{008}$" at compressed address 9 is read from RAM and stored in the left half of register 362. The bit vector associated with uncompressed read address 33 indicates that the uncompressed word of uncompressed read address 33 has 5 non-zero data elements at byte positions 0-2 and 4-5. The read decompression circuit extracts the 5 data elements from register 362 beginning at the ninth byte (data element position 000) from the right, generates and outputs uncompressed read data "0 0 $d'_{013}d'_{012}$ 0 $d'_{010}d'_{009}d'_{008}$" based on the extracted data values and bit vector, and writes 001_101 to the entry in the read pointer table for block 1. Note that the state of the Overflow signal can be delayed/buffered for one cycle. The delayed Overflow signal from cycle 4 is logic 1 and signals in cycle 5 that extraction is to begin at the rightmost byte in the left half of register 362. The read table entry 001_101 indicates that the previously read compressed read address was compressed address 1, and that the next extraction is to begin at the sixth data element from the right (data element position 101).

Read decompression processing continues for cycles 6 and 7 as described above. Note that in cycle 6, another word of compressed read data need not be read, because the bit vector indicates only two non-zero values need to be extracted, and the register 362 has a sufficient number of non-zero values to fill the uncompressed read data for uncompressed read address 34. In cycle 8, the decompression changes from decompressing block 1 data to decompressing block 0 data. The uncompressed read address 4 and associated bit vector are input. The value of the uncompressed read address is that of a block (block 0) different from the block (block 1) of the previously input uncompressed read address (35), and in response the New block signal is set.

The read decompression circuit reads the read pointer table entry 010_011 for block 0, which was stored in cycle 3. The entry indicates that the previously read compressed word of block 0 was at compressed address 2 (010), and that the next extraction is to begin at the fourth data element (data element position 011) in register 362. The bit vector indicates that the uncompressed word is to contain 1 non-zero data element at position 7.

The compressed word in the left half of register 362 is shifted to the right half, and the compressed word of compressed read address 2 ($d_{043}d_{042}d_{041}d_{040}d_{039}d_{031}d_{030}d_{028}$) is read and stored in the left-most 8 bytes of the scratchpad pipeline registers 362. The read decompression circuit extracts one data elements from register 362 at the twelfth byte from the right (fourth byte from the right-most position of the left half), as the New block signal indicates that the right half of register 362 has non-zero data elements of the previous block. The extracted data element and bit vector are used to generate uncompressed read data "$d_{039}$ 0 0 0 0 0 0." The read decompression circuit writes 010_100 to the entry in the read pointer table for block 0 to indicate that the previously read compressed read address was compressed address 2, and that the next extraction is to begin at the fifth data element from the right (data element position 100).

The example continues as described above with the input of uncompressed read address 5 and the associated bit vector in cycle 9.

Figure 9:
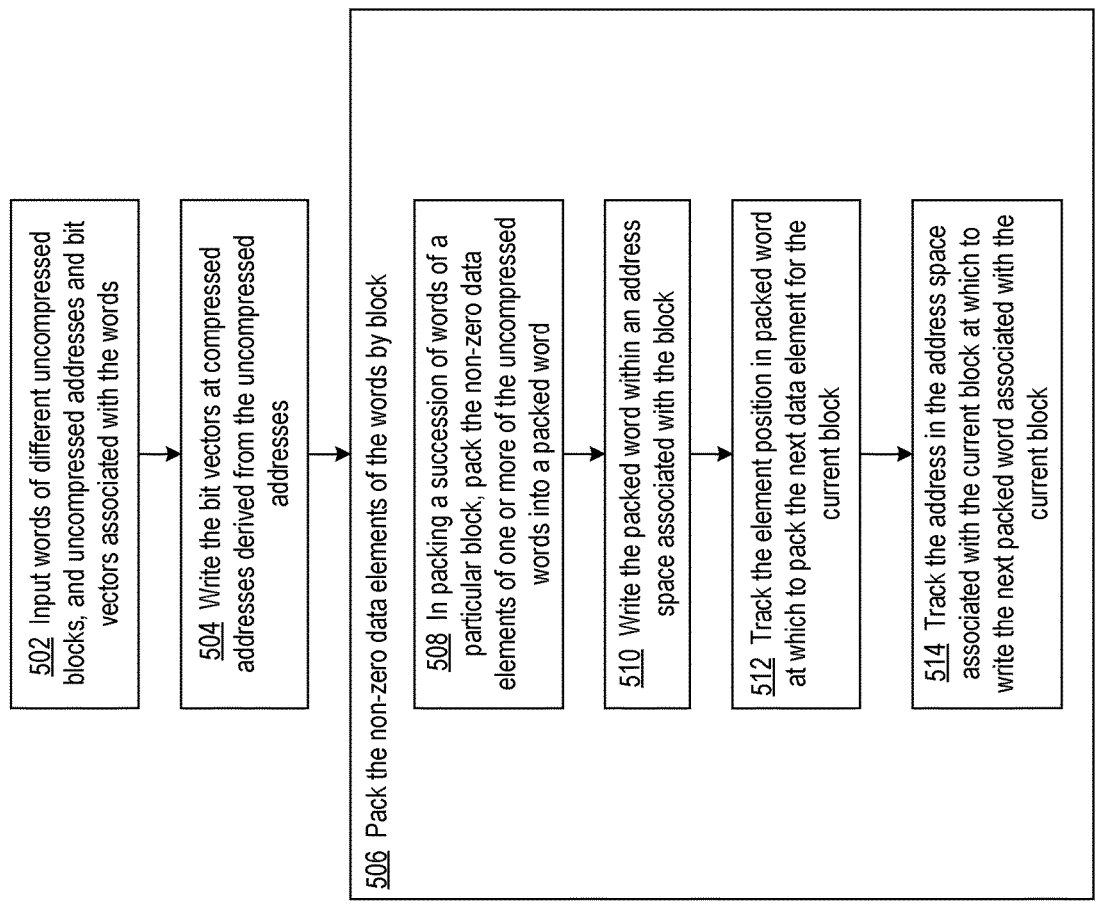
FIG. 9 shows a flowchart of an exemplary process for compressing multiple sparse blocks of data.

FIG. 9 shows a flowchart of an exemplary process for compressing multiple sparse blocks of data. Up to N blocks of data at a time can be undergoing compression. That is, one or more uncompressed words of one block can be input for compression, and before all the uncompressed words of that block have been compressed, one or more uncompressed words of another block can be input for compression. Additional uncompressed words of the first block can be subsequently input for compression.

At block 502, uncompressed words of different blocks are input to a write compression circuit 210 (FIG. 4). Along with each uncompressed word, an associated uncompressed address and an associated bit vector are input to the write compression circuit.

At block 504, the write compression circuit derives a compressed address from each input uncompressed address and writes the associated bit vector at the compressed address. The compressed address of the bit vector associated with a uncompressed word address can be determined using a modulo (N*M) computation, where N is the number of blocks that can be undergoing compression and M is the number of packed words allocated to storing compressed data of each block. The address of the bit vector can be: base address+uncompressed address modulo (N*32).

The operations of block 506 are performed by the write compression circuit in compressing the non-zero data elements of uncompressed words into packed words. At block 508, the non-zero data elements of a sequence of one or more uncompressed words (having associated sequential uncompressed addresses) are packed into a packed word. The number of uncompressed words in the sequence depends on the number of non-zero data elements in each uncompressed word and the size of each compressed word (the maximum number of non-zero data elements within compressed word).

At block 510, each packed word is written to a compressed address derived in part from the associated uncompressed address. The packed words are written sequentially in the address space associated with the block undergoing compression. The write compression circuit writes a packed word in response to the packed word register being full of non-zero data elements of a block or in response to the current input compressed word being of a block other than the block of the previously input compressed word.

The write compression circuit performs the operations of blocks 512 and 514 in order to accommodate compressing portions of blocks one after another. For example, the write compression circuit may complete compression of a portion (one or more uncompressed words) of one block and then input an uncompressed word of another block before additional portions of the uncompressed words of the one block have been compressed. The write compression circuit can switch from compressing one block to compressing a portion of another block, and switch to compressing a portion of yet another block, etc. At block 512, after compressing an uncompressed word, the write compression circuit tracks the position within a packed word register at which to store the next non-zero data element of the next uncompressed word of the same block. At block 514, the write compression circuit tracks the address within the address space of the block at which the last packed word was written.

Figure 10:
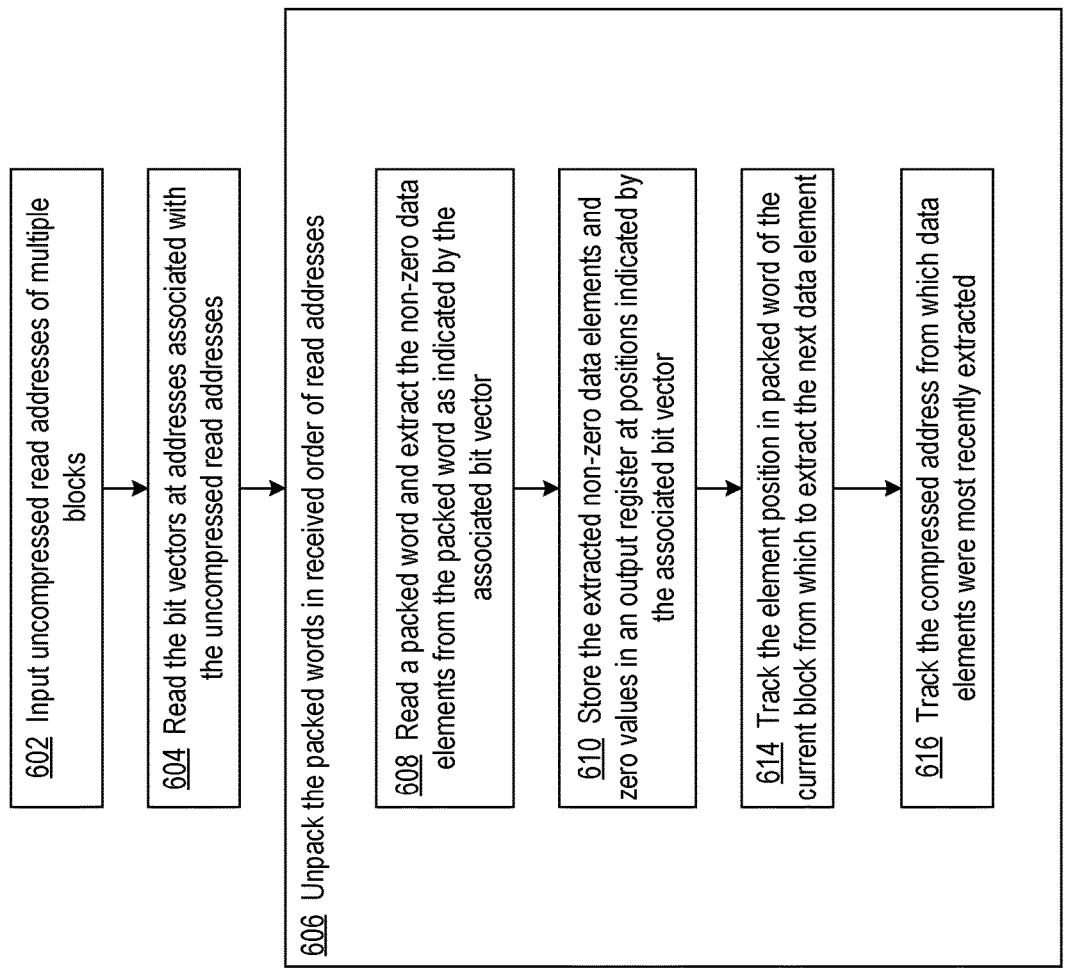
FIG. 10 shows a flowchart of an exemplary process for decompressing multiple blocks of compressed data.

FIG. 10 shows a flowchart of an exemplary process for decompressing multiple blocks of compressed data. Up to N blocks of data at a time can be undergoing decompression. That is, one or more compressed addresses of one block can be input to obtain uncompressed data, and before all the compressed data of that block have been decompressed, one or more compressed addresses of another block can be input to obtain uncompressed data. Additional uncompressed addresses of the first block or another block can be subsequently input to obtain uncompressed data.

At block 602, the read decompression controller inputs uncompressed read addresses of multiple blocks. At block 604, the read decompression controller reads for each input uncompressed read address, the bit vector associated with the address. The address of the bit vector can be determined as described above.

The read decompression controller performs the operations of block 606 in unpacking the non-zero data elements from packed words in order of each uncompressed address. At block 608, the read decompression controller reads a packed word and extracts the number of non-zero data elements indicated by the associated bit vector. At block 610, the extracted non-zero data elements and zero values are stored in an output register at positions indicated by the bit vector.

The read decompression controller tracks for each block in decompressing the data for each uncompressed address, a data element position within a packed word and a compressed address, because a packed word can contain non-zero data elements of more than one uncompressed address, and portions of multiple blocks can be decompressed one after another. At block 614, the read decompression controller stores the element position within the packed word from which to extract the next data element for the next uncompressed address of a block. At block 616, the read decompression controller stores the compressed address of the packed word from which the data elements were most recently extracted.

Figure 11:
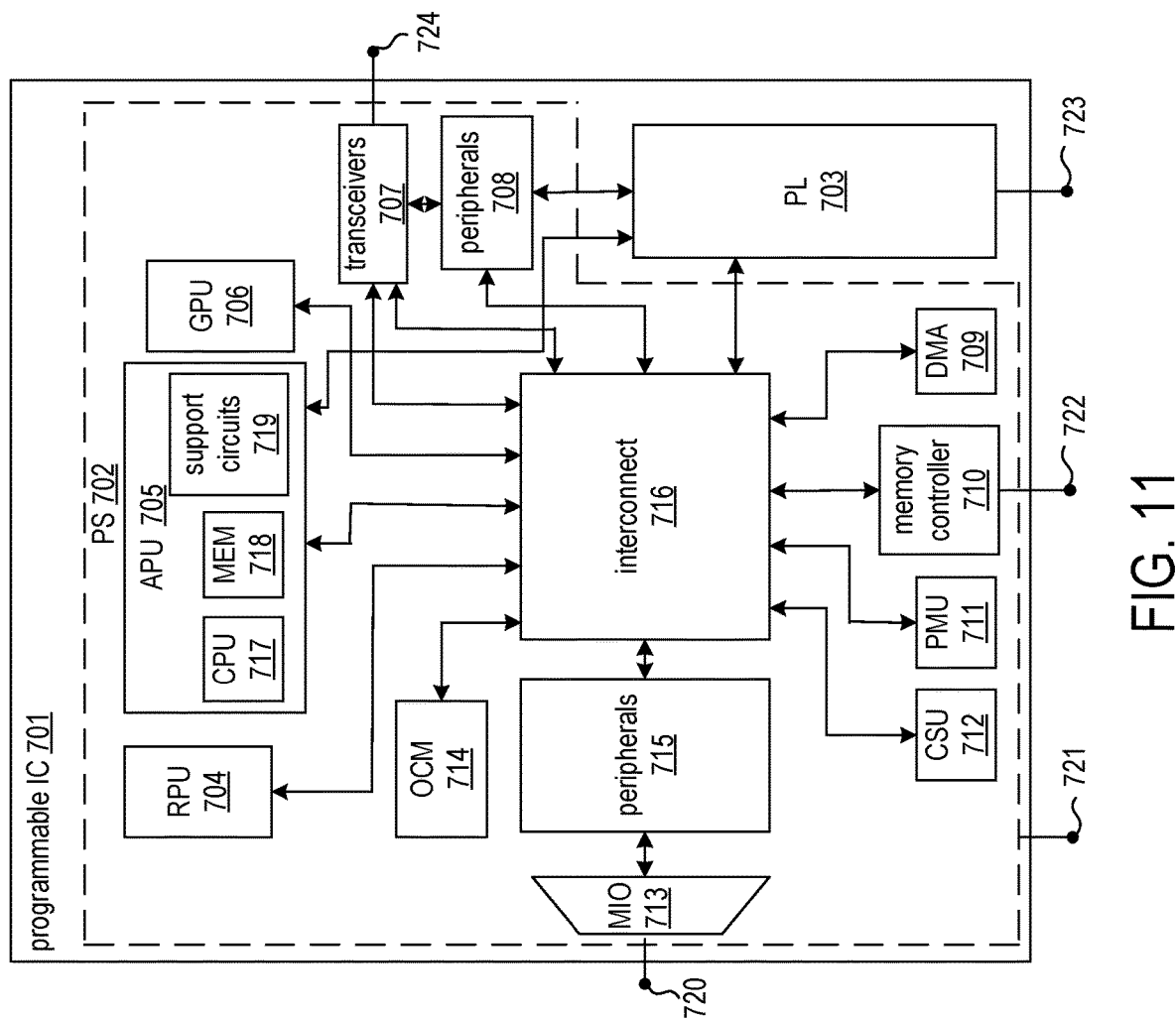
FIG. 11 is a block diagram depicting an exemplary System-on-Chip.

FIG. 11 is a block diagram depicting an exemplary System-on-Chip (SoC) 701 that can host the disclosed compression and decompression circuitry. In the example, the SoC includes the processing subsystem (PS) 702 and the programmable logic subsystem 703. The processing subsystem 702 includes various processing units, such as a real-time processing unit (RPU) 704, an application processing unit (APU) 705, a graphics processing unit (GPU) 706, a configuration and security unit (CSU) 712, and a platform management unit (PMU) 711. The PS 702 also includes various support circuits, such as on-chip memory (OCM) 714, transceivers 707, peripherals 708, interconnect 716, DMA circuit 709, memory controller 710, peripherals 715, and multiplexed (MIO) circuit 713. The processing units and the support circuits are interconnected by the interconnect 716. The PL subsystem 703 is also coupled to the interconnect 716. The transceivers 707 are coupled to external pins 724. The PL 703 is coupled to external pins 723. The memory controller 710 is coupled to external pins 722. The MIO 713 is coupled to external pins 720. The PS 702 is generally coupled to external pins 721. The APU 705 can include a CPU 717, memory 718, and support circuits 719. The APU 705 can include other circuitry, including L1 and L2 caches and the like. The RPU 704 can include additional circuitry, such as L1 caches and the like. The interconnect 716 can include cache-coherent interconnect or the like.

Referring to the PS 702, each of the processing units includes one or more central processing units (CPUs) and associated circuits, such as memories, interrupt controllers, direct memory access (DMA) controllers, memory management units (MMUs), floating point units (FPUs), and the like. The interconnect 716 includes various switches, busses, communication links, and the like configured to interconnect the processing units, as well as interconnect the other components in the PS 702 to the processing units.

The OCM 714 includes one or more RAM modules, which can be distributed throughout the PS 702. For example, the OCM 714 can include battery backed RAM (BBRAM), tightly coupled memory (TCM), and the like. The memory controller 710 can include a DRAM interface for accessing external DRAM. The peripherals 708, 715 can include one or more components that provide an interface to the PS 702. For example, the peripherals can include a graphics processing unit (GPU), a display interface (e.g., DisplayPort, high-definition multimedia interface (HDMI) port, etc.), universal serial bus (USB) ports, Ethernet ports, universal asynchronous transceiver (UART) ports, serial peripheral interface (SPI) ports, general purpose (GPIO) ports, serial advanced technology attachment (SATA) ports, PCIe ports, and the like. The peripherals 715 can be coupled to the MIO 713. The peripherals 708 can be coupled to the transceivers 707. The transceivers 707 can include serializer/deserializer (SERDES) circuits, MGTs, and the like.

Various logic may be implemented as circuitry to carry out one or more of the operations and activities described herein and/or shown in the figures. In these contexts, a circuit or circuitry may be referred to as "logic," "module," "engine," or "block." It should be understood that logic, modules, engines and blocks are all circuits that carry out one or more of the operations/activities. In certain implementations, a programmable circuit is one or more computer circuits programmed to execute a set (or sets) of instructions stored in a ROM or RAM and/or operate according to configuration data stored in a configuration memory.

Though aspects and features may in some cases be described in individual figures, it will be appreciated that features from one figure can be combined with features of another figure even though the combination is not explicitly shown or explicitly described as a combination.

The methods and circuitry are thought to be applicable to a variety of systems for compressing and decompressing sparse data sets. Other aspects and features will be apparent to those skilled in the art from consideration of the specification. The methods and circuitry may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A method comprising:
packing non-zero data elements of a succession of words of a plurality of uncompressed blocks into packed words by a compression circuit, wherein the packing includes:
packing non-zero data elements of one or more words of the succession in each packed word,
restricting each packed word to data elements of one uncompressed block of the plurality of uncompressed blocks, and
writing each packed word in a RAM and within a compressed address range associated with the one uncompressed block, wherein the writing includes:
initiating the writing in response to the packed word being full of non-zero data elements, or initiating the writing before the packed word is full of non-zero data elements of the one uncompressed block of the plurality of uncompressed blocks, in response to a next input word of the succession being of another uncompressed block of the plurality of uncompressed blocks.

2. The method of claim 1, wherein the writing each packed word within the compressed address range associated with the one uncompressed block includes writing within the compressed address range that has a fixed size corresponding to a minimum level of sparsity of the uncompressed blocks.

3. The method of claim 1, wherein the inputting the succession of words of data elements includes inputting words of each uncompressed block in sequential address order of the words.

4. The method of claim 1, further comprising:
inputting with each word an associated uncompressed write address;
bypassing the packing in response to a bypass signal input to the compression circuit; and
writing, in response to the bypass signal, each word of the succession in a RAM at the associated uncompressed write address.

5. The method of claim 1, further comprising:
inputting with each word an associated uncompressed write address; and
wherein the packing includes converting the uncompressed address to a compressed address.

6. The method of claim 1, further comprising maintaining concurrently in the RAM of packed words, packed words from a maximum of N uncompressed blocks of the plurality of uncompressed blocks, wherein N is a power of 2 greater than or equal to 2.

7. The method of claim 6, wherein the uncompressed blocks have a block-address-relative order, and the N uncompressed blocks are sequential in the block-address-relative order.

8. The method of claim 6, wherein the packing includes:
maintaining during packing of non-zero data elements of the words of each uncompressed block, data that indicate a location that a next packed word is to be written in the compressed address range associated with the uncompressed block and data that indicate a location in a packed word that a non-zero data element of a next word of an uncompressed block in the succession is to be written.

9. The method of claim 1, further comprising:
inputting to the compression circuit bit vectors associated with the words, wherein each bit vector indicates ones of the data elements that are non-zero in the associated word of data elements;
writing each bit vector in a RAM at an address associated with the associated word of data elements and uncompressed block; and
inputting uncompressed read addresses to a decompression circuit;
reading bit vectors associated with the uncompressed read addresses from the RAM of bit vectors;
determining compressed address ranges from the uncompressed read addresses;
determining compressed read addresses from the determined compressed address ranges and stored data that indicate offsets in the determined compressed address ranges;
unpacking data elements from packed words in the RAM of packed words into uncompressed words associated with the uncompressed read addresses by the decompression circuit, wherein the unpacking includes:
maintaining for each block, respective data that indicate a last-read compressed read address and a next-data-element position from which to extract a data element from a last-read packed word at the last-read compressed read address,
reading from the RAM of packed words, a packed word at a compressed read address following the last-read compressed read address, in response to the associated bit vector indicating non-zero data elements of the uncompressed read address are greater in number than remaining data elements in the last-read packed word as indicated by the next-data-element position,
extracting from a packed word buffer, a number of non-zero data elements indicated by bit vector associated with the uncompressed read address from which the compressed read address was determined,
generating in a register, an uncompressed word having at data element positions indicated by the associated bit vector, zero-value data elements and values of the one or more non-zero data elements; and
outputting the uncompressed word.

10. The method of claim 9, wherein:
the inputting the succession of words of data elements includes inputting words of each uncompressed block in sequential address order of the words; and
the writing each packed word within the compressed address range associated with the one uncompressed block includes writing within the compressed address range that has a fixed size corresponding to a minimum level of sparsity of the uncompressed blocks.

11. A circuit arrangement comprising:
a first random access memory (RAM)
a write compression circuit configured to:
pack non-zero data elements of a succession of words of a plurality of uncompressed blocks into packed words, by performing operations of:
packing non-zero data elements of one or more words of the succession in each packed word,
restricting each packed word to data elements of one uncompressed block of the plurality of uncompressed blocks, and
writing each packed word in the RAM and within a compressed address range associated with the one uncompressed block, wherein the writing includes initiating the writing in response to the packed word being full of non-zero data elements, or initiating the writing before the packed word is full of non-zero data elements of the one uncompressed block of the plurality of uncompressed blocks, in response to a next input word of the succession being of another uncompressed block of the plurality of uncompressed blocks.

12. The circuit arrangement of claim 11, wherein the write compression circuit is configured to write each packed word within the compressed address range that has a fixed size corresponding to a minimum level of sparsity of the uncompressed blocks.

13. The circuit arrangement of claim 11, wherein the write compression circuit is configured to input the succession of words of data elements of each uncompressed block in sequential address order of the words.

14. The circuit arrangement of claim 11, wherein:
the write compression circuit is configured to input with each word an associated uncompressed write address; and
the write compression circuit includes a sub-circuit configured to, in response to a bypass signal:
bypass the packing of non-zero data elements, and
write each word of the succession in a RAM at the associated uncompressed write address.

15. The circuit arrangement of claim 11, wherein the write compression circuit is configured to:
input with each word an associated uncompressed write address; and
convert the uncompressed address to a compressed address.

16. The circuit arrangement of claim 11, wherein the write compression circuit is configured to concurrently maintain in the first RAM, packed words from a maximum of N uncompressed blocks of the plurality of uncompressed blocks, wherein N is a power of 2 greater than or equal to 2.

17. The circuit arrangement of claim 16, wherein the uncompressed blocks have a block-address-relative order, and the N uncompressed blocks are sequential in the block-address-relative order.

18. The circuit arrangement of claim 16, wherein the write compression circuit is configured to:
maintain in a memory circuit during packing of non-zero data elements of the words of each uncompressed block, data that indicate a location that a next packed word is to be written in the compressed address range associated with the uncompressed block and data that indicate a location in a packed word that a non-zero data element of a next word of an uncompressed block in the succession is to be written.

19. The circuit arrangement of claim 11, wherein the write compression circuit is configured to input bit vectors associated with the words, and each bit vector indicates ones of the data elements that are non-zero in the associated word of data elements, and the circuit arrangement further comprising:
  a second RAM, wherein the write compression circuit is configured to write each bit vector in the second RAM at an address associated with the associated word of data elements and uncompressed block; and
  a read decompression circuit configured to:
    input uncompressed read addresses;
    read bit vectors associated with the uncompressed read addresses from the second RAM;
    determine compressed address ranges from the uncompressed read addresses;
    determine compressed read addresses from the determined compressed address ranges and stored data that indicate offsets in the determined compressed address ranges; and
    unpack data elements from packed words in the first RAM into uncompressed words associated with the uncompressed read addresses by performing operations including:
      maintaining for each block, respective data that indicate a last-read compressed read address and a next-data-element position from which to extract a data element from a last-read packed word at the last-read compressed read address,
      reading from the first RAM, a packed word at a compressed read address following the last-read compressed read address, in response to the associated bit vector indicating non-zero data elements of the uncompressed read address are greater in number than remaining data elements in the last-read packed word as indicated by the next-data-element position,
      extracting from a packed word buffer, a number of non-zero data elements indicated by bit vector associated with the uncompressed read address from which the compressed read address was determined,
      generating in a register, an uncompressed word having at data element positions indicated by the associated bit vector, zero-value data elements and values of the one or more non-zero data elements, and
      outputting the uncompressed word.

20. The circuit arrangement of claim 19, wherein the read decompression circuit configured to:
    input words of each uncompressed block in sequential address order of the words; and
    write each packed word within the compressed address range that has a fixed size corresponding to a minimum level of sparsity of the uncompressed blocks.

* * * * *